US008648466B2

(12) United States Patent  
Sidorov et al.

(10) Patent No.: US 8,648,466 B2  
(45) Date of Patent: Feb. 11, 2014

(54) METHOD FOR PRODUCING A METALLIZATION HAVING TWO MULTIPLE ALTERNATING METALLIZATION LAYERS FOR AT LEAST ONE CONTACT PAD AND SEMICONDUCTOR WAFER HAVING SAID METALLIZATION FOR AT LEAST ONE CONTACT PAD

(75) Inventors: Victor Sidorov, Berlin (DE); Rimma Zhytnytska, Berlin (DE); Joachim Wuerfl, Zuethen (DE)

(73) Assignee: Forschungsverbund Berlin E.V., Berlin (DE)

( * ) Notice: Subject to any disclaimer, the term of this patent is extended or adjusted under 35 U.S.C. 154(b) by 0 days.

(21) Appl. No.: 13/257,346

(22) PCT Filed: Mar. 18, 2010

(86) PCT No.: PCT/EP2010/053553  
§ 371 (c)(1),  
(2), (4) Date: Nov. 30, 2011

(87) PCT Pub. No.: WO2010/106144  
PCT Pub. Date: Sep. 23, 2010

(65) Prior Publication Data  
US 2012/0080794 A1    Apr. 5, 2012

(30) Foreign Application Priority Data

Mar. 19, 2009   (DE) .......................... 10 2009 013 921

(51) Int. Cl.  
    *H01L 23/48*   (2006.01)
(52) U.S. Cl.  
    USPC ........................................................ 257/751
(58) Field of Classification Search  
    USPC ........................................................ 257/751  
    See application file for complete search history.

(56) References Cited

U.S. PATENT DOCUMENTS 3,362,851 A * 1/1968 Dunster .................... 428/601  
6,362,090 B1   3/2002 Paik et al.  
(Continued)

FOREIGN PATENT DOCUMENTS

DE      14 39 527 A1   10/1968  
DE      690 14 871 T2   5/1995  
(Continued)

OTHER PUBLICATIONS

International Search Report Dated Sep. 2, 2010.

*Primary Examiner* — Anthony Ho  
(74) *Attorney, Agent, or Firm* — Norris McLaughlin & Marcus P.A.

(57) ABSTRACT

The invention relates to a method for producing a metallization for at least one contact pad and a semiconductor wafer having metallization for at least one contact pad. The invention relates to a metallization (and a semiconductor wafer having corresponding metallization) and to a method for the production thereof that first of all can be produced by means of physical gas phase separation (dry separation) and secondly ensures sufficient adhesion of a lot bump. The method for producing a metallization (40) for at least one contact pad (20) according to the invention comprises the following process steps: applying at least one contact pad (20) to a substrate (10), applying a barrier layer (30) to the top side of the at least one contact pad (20) and applying a metallization (40) to the top side of the barrier layer (30), characterized in that the barrier layer (30) and the metallization (40) are applied by means of physical separation and that the metallization (40) is designed as a layer structure having two multiple alternating metallization layers (41, 42), wherein the first metallization layer (41) is made of nickel or an Ni alloy having a layer thickness of less than 500 nm and the second metallization layer (42) is made of a material that is different than nickel and is electrically conductive.

17 Claims, 6 Drawing Sheets

(56) References Cited

U.S. PATENT DOCUMENTS

Figure 1:
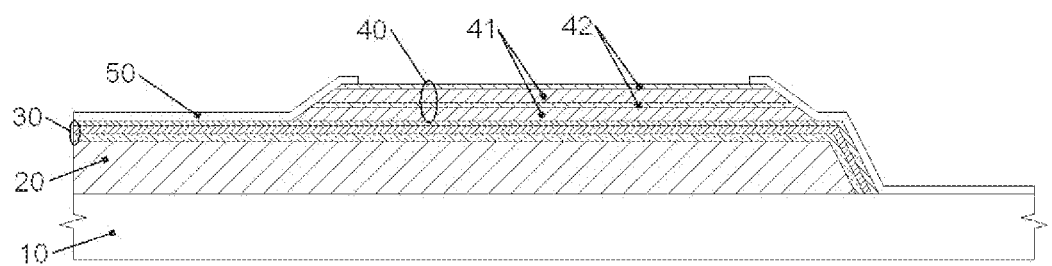

| | | |
|---|---|---|
| 2003/0067073 A1* | 4/2003 | Akram et al. .................. 257/738 |
| 2003/0124833 A1 | 7/2003 | Tong et al. |
| 2003/0194854 A1* | 10/2003 | Farnworth .................... 438/612 |
| 2006/0284313 A1 | 12/2006 | Wang |
| 2007/0045848 A1* | 3/2007 | Tai et al. ....................... 257/738 |
| 2009/0021109 A1* | 1/2009 | Furukawa et al. ........ 310/313 R |

FOREIGN PATENT DOCUMENTS

| | | |
|---|---|---|
| DE | 103 22 135 A1 | 12/2004 |
| JP | 10 163590 A | 6/1998 |
| JP | 2006 019550 A | 1/2006 |

* cited by examiner

METHOD FOR PRODUCING A METALLIZATION HAVING TWO MULTIPLE ALTERNATING METALLIZATION LAYERS FOR AT LEAST ONE CONTACT PAD AND SEMICONDUCTOR WAFER HAVING SAID METALLIZATION FOR AT LEAST ONE CONTACT PAD

The present invention relates to a method for producing a metallization for at least one contact pad and to semiconductor wafer with a metallization for at least one contact pad with the features recited in claims 1 and 9; in particular, the present invention relates to an improved technology for producing contact areas (contact pads) with a metallization, also referred to as under bump metallization (UBM) for electrical connections between semiconductor structures and an additional connecting partner.

Flip-Chip-Mounting (also inverted mounting) refers to a method for contacting contact pads of bare semiconductor chips (also wafers, semiconductor wafers) by contact bumps—so-called "bumps." The flip-chip technology is also used in the production of complex microprocessors. With flip-chip-mounting, the chip is mounted directly, without additional connecting wires, with the active contact side facing downward—towards the circuit carriers. This results in particularly small housing dimensions and short interconnecting wires. This technology is frequently the only possible practical connection for very complex circuits, because several thousand contacts must sometimes be realized. For example, the entire surface area of the semiconductor chip can then be used for contacting. With the flip-chip bonding technique, all contacts are connected simultaneously.

With flip-chip-mounting, a metal or a metal mixture, the solder, is deposited on the semiconductor chip or wafer or a printed circuit board. Thousands of cylindrical or spherical solder bodies are thereby produced, depending on the placement method. These solder bodies are each located exactly on the contact points which produce a connection to the circuit structures of the lower layers of the wafer (semiconductor chips). The solder bodies are subsequently melted in a reflow process to form small spheres, producing a connection with good electrical conductivity and excellent adherence between the solder body and the chip-side metallization (under bump metallization), with a eutectic solder body assuming a quasi hemispherical surface. These solder balls also referred to as "bumps."

Frequently, a metallization (a so-called "under bump metallization") is used between the bump and the contact pad of the semiconductor chip which increases the mechanical loading capability of the connection between the bump and the contact pad. The metallization frequently also operates to prevent diffusion of metal atoms from the contact pad into the bump, which would otherwise cause the connection to become unstable.

Another method for providing a wafer with "bumps" is screen printing. The wafer is printed in a screen printing press with solder paste after having received a solderable surface on the pads by a galvanic process. The wafer is then here also subjected to a reflow process, whereby the solder paste melts and bumps are produced. The wafer can then be cleaned, if necessary, to remove excess flux residues.

It is known to produce the metallization by deposition a diffusion barrier over the entire surface area by sputtering, thereafter sputtering a thin starting layer for a subsequent galvanic process, lithographically structuring (positive) and galvanically depositing a 5-10 μm thick UBM layer. Thereafter, the diffusion barrier and the starting layer are etched.

Alternatively, an electroless deposition can be used for producing a metallization. In this case, nickel-phosphorus is electrolessly deposited on an Al pad after suitable pretreatment (e.g., zincate treatment), whereafter gold is electrolessly deposited in suitable chemical baths.

The standard technology for mounting of the (generally tin-containing) flip-chip solder bumps requires a nickel layer with a thickness of several micrometers as UBM, which is necessary to compensate for the consumption of nickel due to the formation of a NiSn-IMC (intermetallic compound), e.g., $Ni_3Sn_4$, during the soldering process. Such nickel layer with a thickness of several micrometers is, as already described in detail, typically produced by galvanic or electroless deposition. However, an entirely dry deposition (sputtering/evaporation) of a nickel layer with a thickness in the micrometer range is not possible because such layer results in high intrinsic mechanical stress and therefore insufficient adhesion.

DE 103 22 135 A1 describes a component with a solder connection between a first partial body having a first surface of metallization and a second partial body having a second surface of metallization, wherein the solder connection includes a solder body made of meltable solder, wherein at least one surface with the first and second surface of metallization facing the solder body has a nanocrystalline layer.

US 2006/0284313 A1 uses for the under bump metallization a material with shape-memory which may consist of an alloy of titanium and nickel.

Disadvantageously, the aforementioned technologies for producing a metallization (UBM) for a contact pad of a semiconductor chip use wet-chemical processes which are frequently associated with the use of toxic or at least potentially corrosive baths (e.g., cyanide bath for Au deposition). Moreover, depending on the actual structure of the surface, the electroless deposition on III/V semiconductors can cause wild deposits. It is therefore an object of the present invention to provide a UBM metallization (e.g., a semiconductor wafer with corresponding metallization) and a method for its manufacture which, on one hand, can be produced by physical gas phase deposition (dry deposition) and which, on the other hand, ensures sufficiently high adhesion of a solder bump.

These objects are solved according to the invention with a semiconductor wafer and a method for its manufacture having the features recited in claims 1 and 9. Preferred embodiments of the invention are recited in the dependent claims.

The method according to the invention for producing a metallization (UBM) for at least one contact pad has the following process steps: depositing at least one contact pad on a substrate (e.g., on a semiconductor wafer), depositing a barrier layer on the top surface of the at least one contact pad, depositing a metallization on the top surface of the barrier layer, wherein the barrier layer and the metallization (and preferably also the contact pad) are deposited by physical deposition (preferably physical vapor deposition, subsequently also referred to as PVD), and the metallization is formed as a layer structure of two multiple alternating metallization layers, wherein the first metallization layer is made of nickel having a layer thickness of less than 1 μm and the second metallization layer is made of an electrically conducting, ductile material that is different from nickel.

The invention thus enables the manufacture of a nickel-based UBM exclusively with a PVD process (preferably sputtering and a preparation). The problem associated with the high intrinsic stress of Ni layers in PVD depositions is hereby solved by depositing following the deposition of a comparatively thin nickel layer or layer of a nickel alloy (layer thickness less than 1 μm, preferably less than 500 nm, still more preferred less than 200 nm) a layer made of a ductile, electrically conducting material (preferably a metal, particularly preferred gold). According to the invention, these two steps (deposition of a nickel layer or nickel alloy layer and a layer made of a ductile, electrically conducting material) are repeated multiple times, resulting in a stack of alternating Ni—/Ni alloy layers and layers made of a ductile, electrically conducting material having a total thickness of several micrometers (preferably greater than 1 µm, still more preferred greater than 2 µm). This method advantageously enables the manufacture of a mechanically and electrically reliable UBM without the use of wet-chemical processes.

The barrier layer is preferably configured to prevent diffusion of metal atoms from the contact pad into the UBM and eventually farther into the solder bump. The barrier layer is preferably made of an amorphous or fine-crystalline metallization or intermetallic compound with decorated grain boundaries, which does not chemically react with the metallization of the contact pad or the UBM. Preferably, intermetallic compounds such as WSiN, TiW, TiMo and the like can be used. The barrier layer has preferably a layer thickness between 50 nm and 1 µm.

The first metallization layer consists of Ni or a Ni-alloy (e.g., NiV). This metallization is metallurgically responsible for the electrical and mechanical properties of the bump—UBM joint and must be matched to the metallurgy of the bump itself. For example, Ni or NiV is suitable for PbSn bumps. The first metallization has a thickness of up to 1 µm, preferably of about 200 nm.

Because of metals corresponding to the first metallization typically have very high mechanical stress when they are deposited by a physical deposition process, a second metallization must be alternatingly introduced, which is capable of absorbing these stresses and which does not adversely affect the metallurgy and the electrical conductivity of the bump—UBM system. Preferably, the second metallization layer includes a material selected from the group gold, silver, platinum, copper, iron, aluminum, zinc, tin and lead, a mixture of at least two of the aforementioned metals or an alloy of the aforementioned metals. Preferably, the second metallization layer is formed from a material having a ductility which corresponds to at least 60% of the ductility of gold, and an electrical conductivity which corresponds to at least 60% of the electrical conductivity of gold. Preferably, the second metallization layer is formed with a layer thickness between 10-100 nm.

Preferably, the contact pad is also deposited by physical deposition. Preferably, the contact pad is deposited by a evapoaration and the barrier layer by sputtering.

Preferably, the first metallization layer is formed with a layer thickness of less than 500 nm. Preferably, the first metallization layer is formed with a layer thickness of less than 200 nm and the second metallization layer of gold is formed with a layer thickness between 30-50 nm.

Preferably, the contact pad is formed with a surface area between 1 µm² and 0.20 m² (corresponding to a wafer diameter of 450 mm), the first metallization layer is formed with a surface area between 1 µm² and 0.20 m², and the second metallization layer is formed with a surface area between 1 µm² and 0.20 m²; in a particularly preferred embodiment, each surface area is between 0.01 and 0.1 mm².

According to the invention, a tin-containing solder bump is used for later contacting by flip-chip-mounting.

The semiconductor wafer according to the invention has at least one contact pad arranged on the semiconductor wafer (preferably several 1000 contact pads, wherein the contact pads preferably implement the external electrical connection of the semiconductor wafer having a microelectronic circuit), wherein a barrier layer is arranged on the top side of the at least one contact pad and a metallization structure is arranged on the top side of the barrier layer, wherein the metallization structure according to the invention has two multiple alternating metallization layers, wherein the first metallization layer is formed of nickel having a layer thickness of less than 1 µm and the second metallization layer is formed of an electrically conducting, ductile material that is different from nickel. Preferably, the barrier layer completely covers the contact pad disposed on the wafer. Preferably, the metallization structure covers at least 50% of the surface area of the contact pad (with the barrier layer located in between)—particularly preferred at least 80% of the surface area of the contact pad.

Preferably, the metallization structure has at least two (preferably at least five) consecutive stacks of a first metallization layer and a second metallization layer. Preferably, the number of consecutive stacks of the first metallization layer and the second metallization layer are selected such that the sum of the layer thicknesses of the first metallization layers is greater than 1 µm (preferably greater than 3 µm).

Preferably, the semiconductor wafer has a semiconductor chip and/or the semiconductor wafer has at least one microelectronic circuit.

Preferably, the semiconductor wafer with the aforementioned features is used for connecting the semiconductor wafer with a circuit carrier by flip-chip-mounting.

The invention will now be described in more detail with reference to exemplary embodiments illustrated in the figures.

Figure 2:
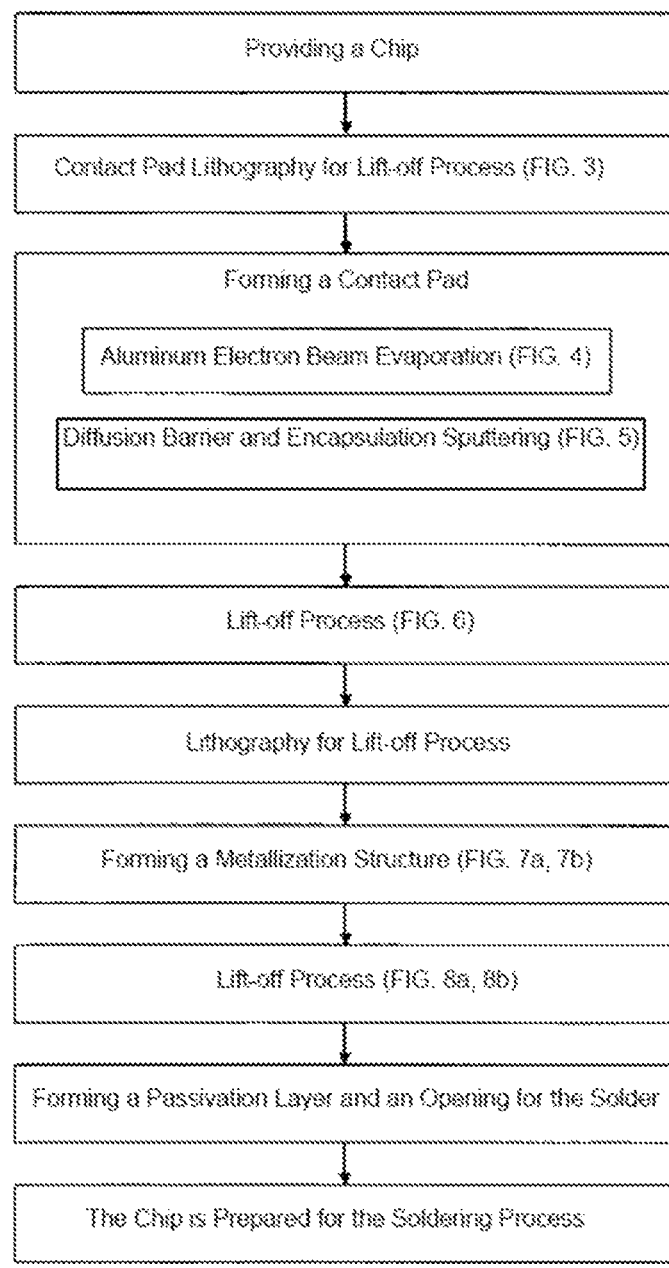

It is shown in:

FIG. 1 a wafer with a metallization structure according to the invention in a schematic cross-sectional diagram, FIG. 2 a flow diagram with the individual process steps of a preferred embodiment of the method of the invention for producing a wafer with the metallization structure according to the invention, and FIG. 3 to FIG. 8b the individual process steps of a preferred embodiment of the method according to the invention.

Figure 3:
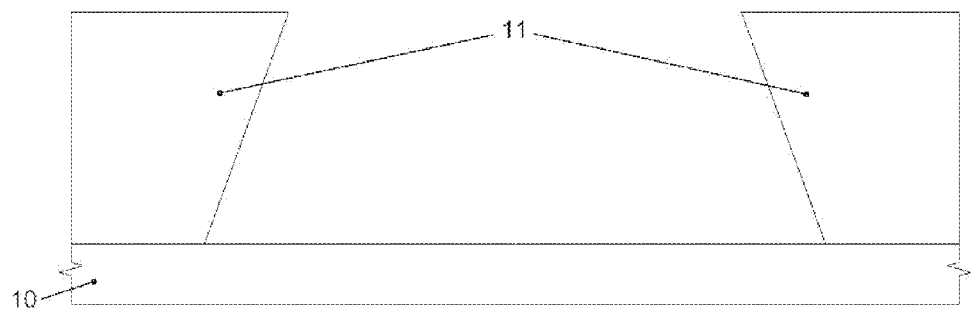
Figure 4:
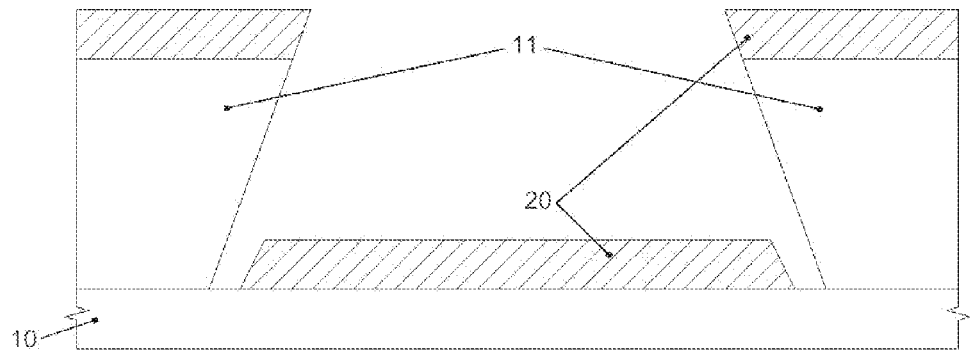

FIG. 1 shows a wafer with a metallization structure according to the invention in a schematic cross-sectional diagram. The wafer 10 may include, for example, a chip or an electronic circuit. For contacting this electronic circuit of the wafer 10 (also referred to as substrate or semiconductor wafer) with a circuit carrier, the wafer 10 has a plurality of contact pads 20, with the electronic circuit of the wafer 10 exchanging the electrical signals (communicating) with the circuit carrier via the contact pads 20. The contact pads 20 may be deposited, for example, from a ductile material, such as Al, Cu or Au by evaporation (e-beam evaporation) by using a mask 11 (FIGS. 3 and 4).

To enable bonding of the wafer 10 and the (unillustrated) circuit carrier by flip-chip-mounting, an (unillustrated) solder bump is deposited between the contact pads 20 and the contacts of the circuit carrier, whereafter the wafer 10 and the circuit carrier are permanently soldered together.

Figure 5:
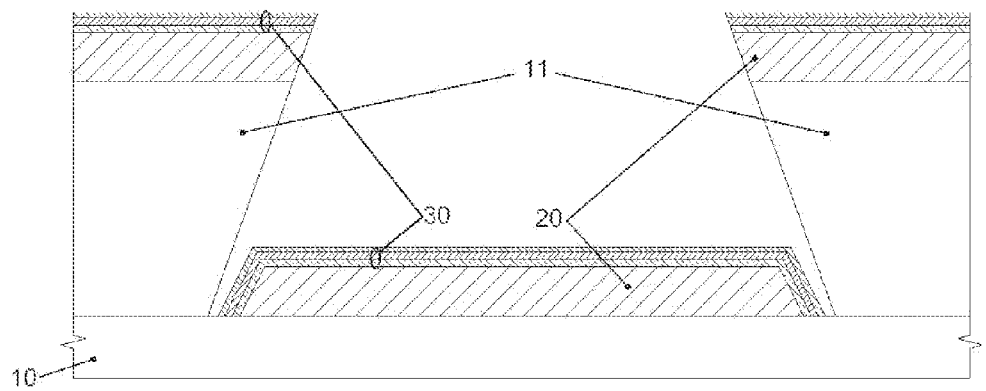
Figure 6:
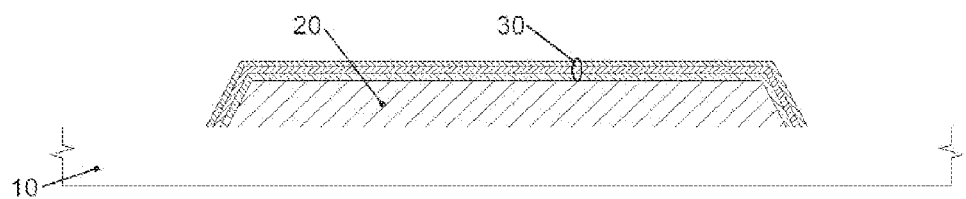

For realizing a mechanically and electrically reliable connection of the solder bump with the contact pad 20 without using wet-chemical processes, a barrier layer 30 is first deposited on the contact pad 20 by sputtering. This may be done, as illustrated in FIGS. 5 and 6, through the same mask that was used for depositing the pads 20. In this case, the method has the additional advantage that the pad metallization is completely surrounded by a diffusion barrier, thus additionally exhibiting higher electromigration stability at high current densities in the metallization. Preferably, entirely different deposition characteristics are used for the contact pads 20 and the barrier layer 30: evaporation of the contact pad 20 has an isotopic characteristic, whereas sputtering of the barrier layer 30 has an anisotropic characteristic. By using a lithographic mask 11 with an undercut (negative resist), the two process steps can be combined by using only a single mask 11. This allows the creation of a contact surface 20 with a defined geometry and subsequent uniform coverage when the diffusion barrier 30 is sputtered (FIGS. 3-6).

Figure 7A:
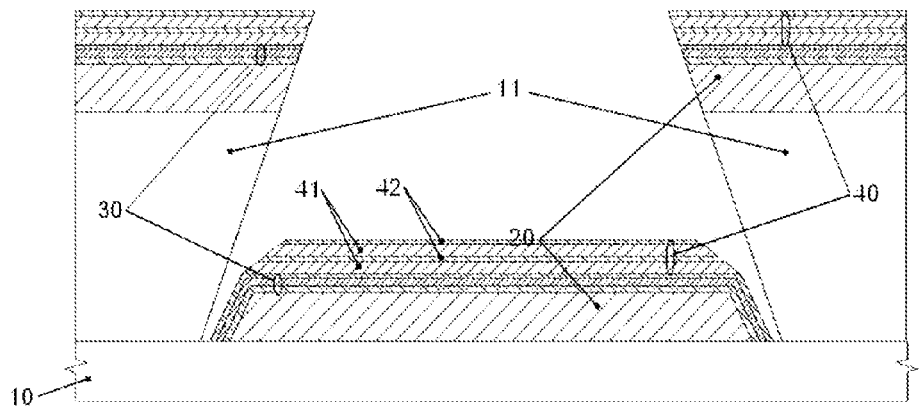
Figure 7B:
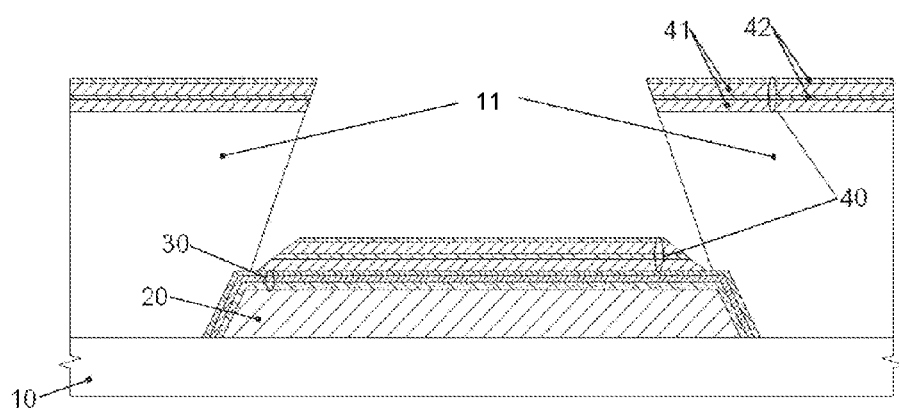
Figure 8A:
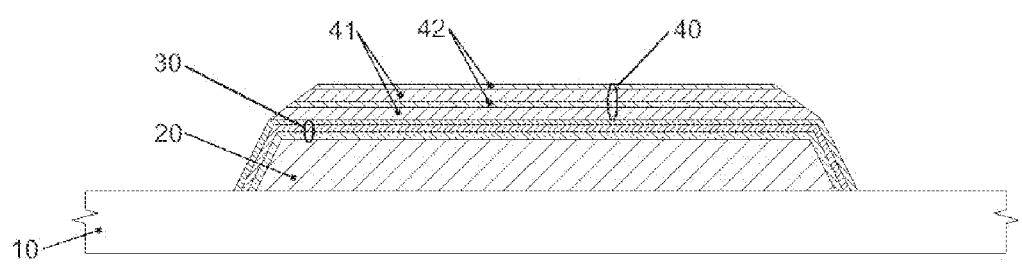
Figure 8B:
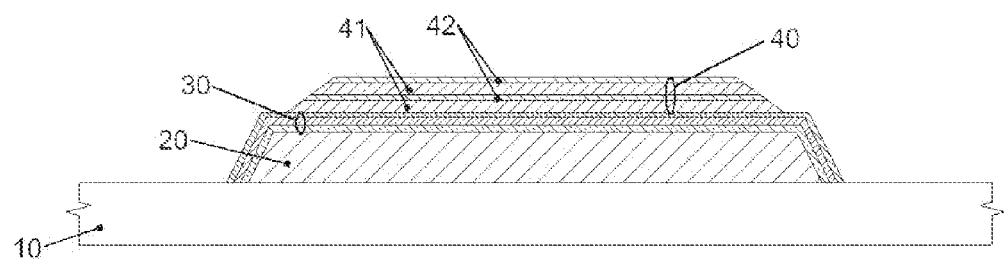

FIG. 7a shows the deposition of alternating metal layers 41, 42 produced, for example, by electron beam evaporation. The metallization structure 40 covers the entire contact surface area 20 by using the same mask 11 that is used for depositing the contact pad 20. Alternatively, the metallization structure 40 may be deposited only on a portion of the contact area of the contact pad 20 (with interposed barrier layer 30), whereby however an additional mask is required (FIG. 7b). The resulting structures after deposition of the alternating layer sequence 41, 42 are illustrated in FIGS. 8a and 8b.

The standard technology for mounting the (typically tin-containing) flip-chip solder bumps requires a nickel layer having a thickness of several micrometers, which is necessary in order to compensate for the consumption of nickel due to the formation of a NiSn-IMC (intermetallic compound) during the solder process.

However, an entirely dry deposition (sputtering/evaporation) of a nickel layer having a thickness in the micrometer range is not possible because the mechanical stress of such layer is too high, causing inadequate adhesion.

The problem associated with high intrinsic stresses of Ni-layers with PVD deposition is solved according to the invention by depositing following the deposition of the a thin Ni-layer (layer thickness less than 500 nm, preferably less than 200 nm, still more preferred less than 150 nm, and still more preferred less than 100 nm) a layer of a ductile, electrically conducting material (preferably a metal, particularly preferred gold with a layer thickness of 30-50 nm).

According to the invention, these two steps (depositing a Ni-layer and a layer of a ductile, electrically conducting material) are repeated several times, producing a stack of alternating Ni-layers and layers of a ductile-electrically conducting material with a total thickness of several micrometers (preferably greater than 1 µm, still more preferred greater than 2 µm).

Due to the interruption of the Ni-layer 41 by the Au-layer 42, the following Ni-layer 41 has no or a significantly reduced initial mechanical stress. This method advantageously enables the manufacture of a mechanically and electrically reliable UBM without the use of wet-chemical processes.

After deposition of the metallization structure 40, a passivation layer 15 is preferably deposited (FIG. 1), which covers the lateral regions of the layer stack 41, 42 and defines the contact surface of the (unillustrated) solder bump.

| List of references symbols | |
|---|---|
| 10 | Substrate |
| 11 | Mask |
| 20 | Contact pad |
| 30 | Diffusion barrier |
| 40 | Metallization structure |
| 41 | Nickel layer |
| 42 | Gold layer |
| 50 | Passivation layer |

The invention claimed is:

1. Method for producing a metallization (40) for at least one contact pad (20) with the following method steps:
    using a mask for depositing at least one contact pad (20) on a substrate (10),
    using said mask for depositing a barrier layer (30) on the top surface of the at least one contact pad (20),
    depositing a metallization (40) on the top surface of the barrier layer (30), wherein the barrier layer (30) and the metallization (40) are deposited by physical deposition, and wherein the metallization (40) is formed as a layer structure comprising first metallization layers (41) alternating with second metallization layers (42) wherein each first metallization layer (41) is formed of nickel or a nickel alloy having a layer thickness less than 1 µm and each second metallization layer (42) is formed of an electrically conducting, ductile material that is different from nickel or a nickel alloy.

2. Method according to claim 1,
    characterized in that
    the second metallization layer (42) is formed of a metal selected from the group consisting of gold, silver, platinum, copper, iron, aluminum, zinc, tin and lead, a mixture of at least two of the aforementioned metals or an alloy of the aforementioned metals.

3. Method according to claim 1,
    characterized in that
    the second metallization layer (42) is made of a material having a ductility corresponding to at least 60% of the ductility of gold, and an electrical conductivity corresponding to at least 10% of the electrical conductivity of gold.

4. Method according to claim 1,
    characterized in that
    the second metallization layer (42) is formed with a layer thickness between 10-200 nm.

5. Method according to claim 1,
    characterized in that
    the contact pad (20) is deposited by physical deposition.

6. Method according to claim 5,
    characterized in that
    the contact pad (20) and the barrier layer (30) are deposited by evaporation or sputtering.

7. Method according to claim 1,
    characterized in that
    the first metallization layer (41) is formed with a layer thickness of less than 500 nm.

8. Method according to claim 1,
    characterized in that
    the first metallization layer (41) is formed with a layer thickness of less than 200 nm and the second metallization layer (42) of gold is formed with a layer thickness between 20-60 nm.

9. Semiconductor wafer with a metallization (40) for at least one contact pad (20), comprising:
    at least one contact pad (20) arranged on a semiconductor wafer (10),
    a barrier layer (30) arranged on the top surface of the at least one contact pad (20) and completely surrounding the at least one contact pad (20),
    a metallization structure (40) arranged on the top surface of the barrier layer (30), wherein the metallization structure (40) has a layer structure comprising first metallization layers (41) alternating with second metallization layers (42), wherein each first metallization structure (41) is formed of nickel or a nickel alloy with a layer thickness of less than 1 µm and each second metallization layer (42) is formed of an electrically conducting material which is different from nickel or a nickel alloy, characterized in that
the second metallization layer (42) is made of a ductile material.

10. Semiconductor wafer according to claim 9, characterized in that
the second metallization layer (42) is made of a material having a ductility corresponding to at least 60% of the ductility of gold, and an electrical conductivity corresponding to at least 10% of the electrical conductivity of gold.

11. Semiconductor wafer according to claim 9, characterized in that
the second metallization layer (42) is formed with a layer thickness between 10-200 nm.

12. Semiconductor wafer according to claim 9, characterized in that
the first metallization layer (41) is formed with a layer thickness of less than 500 nm.

13. Semiconductor wafer according to claim 9, characterized in that
the first metallization layer (41) is formed with a layer thickness of less than 200 nm and the second metallization layer (42) of gold is formed with a layer thickness between 20-60 nm.

14. Semiconductor wafer according to claim 9, characterized in that
the metallization structure (40) comprises at least one of the first metallization layer (41) interposed between two of the second metallization layers (42).

15. Semiconductor wafer according to claim 9, characterized in that
the metallization structure (40) comprises at least five of the first metallization layers (41) each interposed between a different pair of the second metallization layers (42).

16. Semiconductor wafer according to claim 9, characterized in that
the number of the first metallization layers (41) is selected such that the sum of the layer thicknesses of the first metallization layers (41) is greater than 2 µm.

17. Semiconductor wafer according to claim 9, characterized in that
the semiconductor wafer (10) comprises at least one hundred contact path (20) and/or the semiconductor wafer (10) has a semiconductor chip and/or the semiconductor wafer (10) has a microelectronic circuit.

* * * * *